(12) United States Patent
Forejt

(10) Patent No.: US 7,679,444 B2
(45) Date of Patent: Mar. 16, 2010

(54) DIFFERENTIAL AMPLIFIER SYSTEM

(75) Inventor: Brett Forejt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/259,024

(22) Filed: Oct. 27, 2008

(65) Prior Publication Data
US 2009/0108934 A1 Apr. 30, 2009

Related U.S. Application Data

(60) Provisional application No. 60/984,256, filed on Oct. 31, 2007.

(51) Int. Cl.
*H03F 3/45* (2006.01)
(52) U.S. Cl. ...................... 330/258; 330/252
(58) Field of Classification Search ............... 330/258, 330/252, 69, 257, 261
See application file for complete search history.

(56) References Cited

U.S. PATENT DOCUMENTS

| | | | | |
|---|---|---|---|---|
| 5,578,964 | A * | 11/1996 | Kim et al. | 330/253 |
| 6,888,407 | B2 | 5/2005 | Ramazan et al. | |
| 7,268,624 | B2 * | 9/2007 | Chen et al. | 330/258 |
| 7,358,813 | B2 * | 4/2008 | Onishi | 330/258 |
| 7,528,659 | B2 * | 5/2009 | Yokoyama et al. | 330/258 |
| 2005/0116777 | A1 | 6/2005 | Bogner | |
| 2005/0174171 | A1 | 8/2005 | Oswal et al. | |
| 2006/0152282 | A1 | 7/2006 | Halbert et al. | |

FOREIGN PATENT DOCUMENTS

JP 2007 181026 7/2007

OTHER PUBLICATIONS

Banu, et al.: "Fully Differential Operational Amplifiers with Accurate Output Balancing"; IEEE Journal of Solid-State Circuits, vol. 23, No. 6, Dec. 1988; pp. 1410-1414.

* cited by examiner

*Primary Examiner*—Henry K Choe
(74) *Attorney, Agent, or Firm*—John J. Patti; Wade J. Brady, III; Frederick J. Telecky, Jr.

(57) ABSTRACT

One embodiment of the invention includes a differential amplifier circuit. A first input stage generates first and second control voltages in response to a differential input signal. A second input stage generates third and fourth control voltages in response to the differential input signal. The first and second control voltages can be inversely proportional and the third and fourth control voltages can be inversely proportional. The circuit also includes a first output stage that is configured to set a magnitude of a first output voltage of a differential output signal at a first output node in response to the first and second control voltages. The circuit further includes a second output stage that is configured to set a magnitude of a second output voltage of the differential output signal at a second output node in response to the third and fourth control voltages.

19 Claims, 4 Drawing Sheets

US 7,679,444 B2

DIFFERENTIAL AMPLIFIER SYSTEM

RELATED APPLICATIONS

This application claims the benefit of U.S. Provisional Patent Application No. 60/984,256, filed Oct. 31, 2007, which is incorporated herein by reference in its entirety.

TECHNICAL FIELD

This invention relates to electronic circuits, and more particularly to a differential amplifier system.

BACKGROUND

Differential amplifiers are electronic circuits that can amplify a differential input signal to generate a differential output signal. As an example, differential amplifier circuits can be implemented in any of a variety of electronic applications, such as audio and communications applications. Differential amplifiers can be designed to function in a variety of classifications. For example, a Class-A amplifier can provide the differential output signal as a scaled version of the differential input signal. However, in a Class-A amplifier, a sourcing output current always flows through a conducting output device, such that a Class-A amplifier can operate inefficiently with respect to power consumption. A Class-B amplifier can amplify the differential input signal through half of the wave-cycle of the differential input signal based on deactivating the conducting output device on alternating portions of the wave-cycle. However, Class-B amplifiers can be impractical for most applications. Additional amplifier types exist, such as a Class-AB amplifier which can function with characteristics of both Class-A and Class-B amplifiers.

SUMMARY

One embodiment of the invention includes a differential amplifier circuit. A first input stage generates first and second control voltages in response to a differential input signal. A second input stage generates third and fourth control voltages in response to the differential input signal. The first and second control voltages can be inversely proportional and the third and fourth control voltages can be inversely proportional. The circuit also includes a first output stage that is configured to set a magnitude of a first output voltage of a differential output signal at a first output node in response to the first and second control voltages. The circuit further includes a second output stage that is configured to set a magnitude of a second output voltage of the differential output signal at a second output node in response to the third and fourth control voltages.

Another embodiment of the invention includes a method for amplifying a differential input signal to generate a differential output signal. The method includes providing the differential input signal to a first input stage and setting a magnitude of a first control voltage at a first control node and a second control voltage at a second control node associated with the first input stage in response to the differential input signal. The first and second control voltages can have respective magnitudes that are inversely proportional to each other. The method also includes setting a magnitude of a first sourcing output current that flows to a first output node in a first output stage that provides a first portion of the differential output signal in response to the first control voltage. The method further includes setting a magnitude of a first sinking output current that flows from the first output node in response to the second control voltage.

Another embodiment of the invention includes a differential amplifier circuit. A first input stage generates first and second control voltages in response to a differential input signal. A second input stage generates third and fourth control voltages in response to the differential input signal. The first and second control voltages can be inversely proportional and the third and fourth control voltages can be inversely proportional. The circuit also includes a first output stage that is configured to set a magnitude of a first output voltage of a differential output signal at a first output node in response to the first and second control voltages. The circuit also includes a second output stage that is configured to set a magnitude of a second output voltage of the differential output signal at a second output node in response to the third and fourth control voltages. The circuit further includes a common-mode feedback circuit configured to control a common-mode voltage of the differential output signal relative to a common-mode voltage of the differential input signal.

DETAILED DESCRIPTION

The invention relates to electronic circuits, and more particularly to a differential amplifier system. The differential amplifier system can include an amplifier input stage and an amplifier output stage. The amplifier input stage can include a first input stage and a second input stage. Each of the first and second input stages receives a differential input signal as an input, and each of the first and second input stages generates a pair of inversely proportional control voltages. The amplifier output stage can include a first output stage that receives the pair of control voltages from the first input stage and a second output stage that receives the pair of control voltages from the second input stage. The first and second output stages can each control a current flow into and from an output node associated with a respective portion of the differential output signal based on the pair of control voltages.

As a further example, because the first and second control voltages can be inversely proportional, the common-mode control can be employed to mitigate a quiescent current flow through the output stage in providing the differential output signal. Therefore, based on the combined configuration of the amplifier input and amplifier output stages provides for Class AB operation, in which the differential amplifier system can operate to provide the amplification accuracy that is substantially similar to a Class-A differential amplifier while providing a sourcing output current flow characteristic that is substantially similar to a Class-B differential amplifier.

Figure 1:
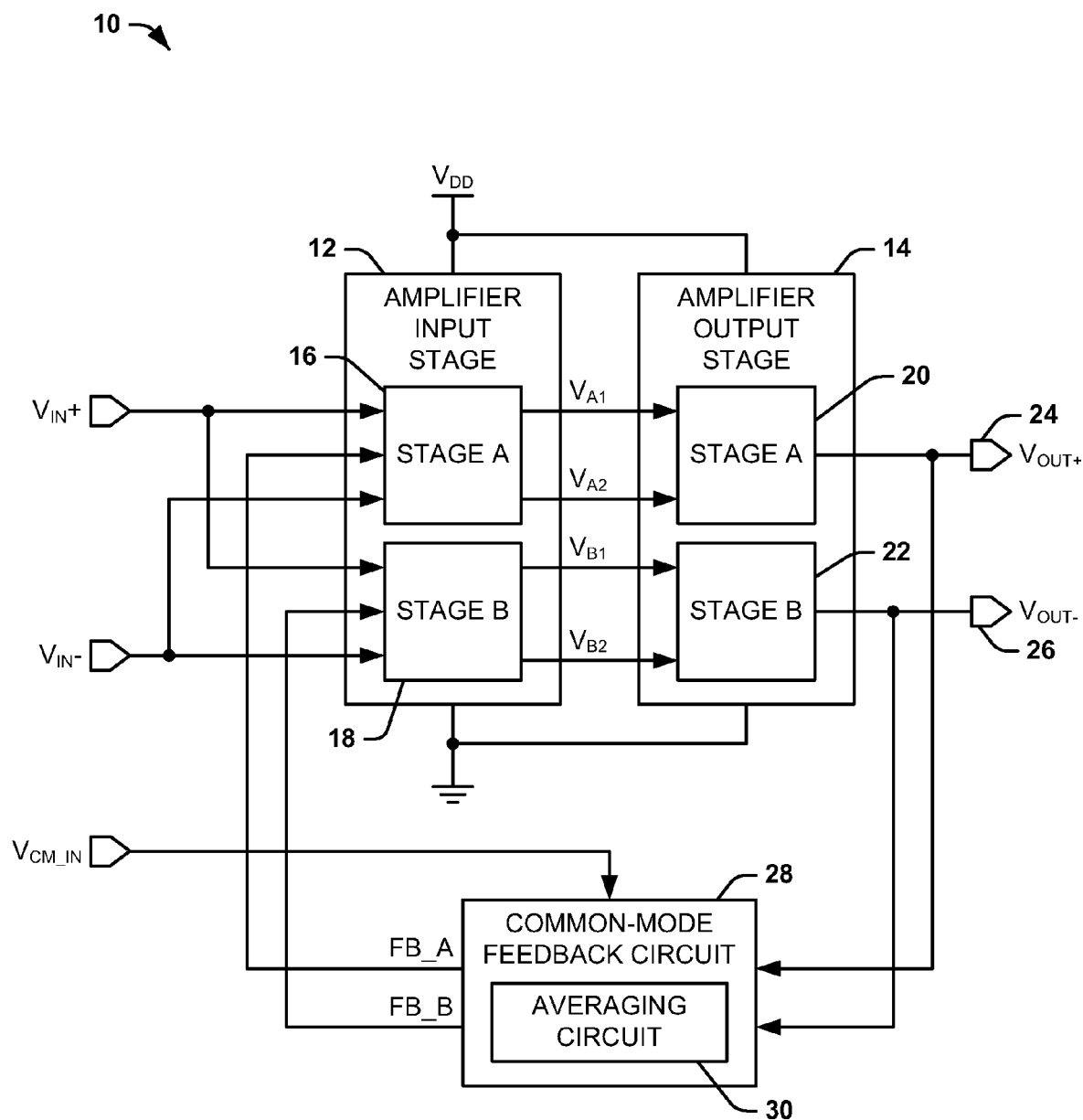
FIG. 1 illustrates an example of a differential amplifier system in accordance with an aspect of the invention.

FIG. 1 illustrates an example of a differential amplifier system 10 in accordance with an aspect of the invention. The differential amplifier system 10 can be implemented in any of a variety of applications to amplify a differential input signal $V_{IN}$ to generate a differential output signal $V_{OUT}$. For example, the differential amplifier system 10 can be implemented as a Class-AB signal amplifier in a preamplifier circuit, such as for an audio application (e.g., driving one or more speakers), or can be implemented in any of a variety of communications and/or controls applications.

The differential amplifier system 10 includes an amplifier input stage 12 and an amplifier output stage 14. Each of the amplifier input and output systems 12 and 14 are interconnected between a first voltage $V_{DD}$ and a second lower voltage, demonstrated in the example of FIG. 1 as ground. $V_{DD}$ and ground can be implemented as voltage rails for an integrated circuit implementing the amplifier system 10. The amplifier input stage 12 includes a first input stage 16 and a second input stage 18, demonstrated in the example of FIG. 1 as STAGE A and STAGE B, respectively. Each of the first and second input stages 16 and 18 receive the differential input signal $V_{IN}$ as an input. In the example of FIG. 1, the differential input signal $V_{IN}$ is demonstrated as having an input voltage $V_{IN+}$ and an input voltage $V_{IN-}$, which are provided relative to an input common-mode voltage for the amplifier system 10.

As an example, the first input stage 16 is configured to generate a pair of control voltages $V_{A1}$ and $V_{A2}$ and the second input stage 18 is configured to generate a pair of control voltages $V_{B1}$ and $V_{B2}$. The control voltages $V_{A1}$ and $V_{B2}$ can have magnitudes that are approximately equal to each other and can be inversely proportional to the control voltages $V_{A2}$ and $V_{B1}$. The control voltages $V_{A2}$ and $V_{B1}$ can likewise have magnitudes that are approximately equal to each other. As an example, each of the control voltages $V_{A2}$ and $V_{B1}$ can be generated in response to the input voltage $V_{IN+}$ and each of the control voltages $V_{A1}$ and $V_{B2}$ can be generated in response to the input voltage $V_{IN-}$.

The amplifier output stage 14 includes a first output stage 20 and a second output stage 22, demonstrated in the example of FIG. 1 as STAGE A and STAGE B, respectively. The first output stage 20 receives the control voltages $V_{A1}$ and $V_{A2}$ as inputs and generates an output voltage $V_{OUT+}$ of the differential output signal $V_{OUT}$ at an output node 24 in response. Similarly, the second output stage 22 receives the control voltages $V_{B1}$ and $V_{B2}$ as inputs and generates an output voltage $V_{OUT-}$ of the differential output signal $V_{OUT}$ at an output node 26 in response. Therefore, the first and second output stages 20 and 22 cooperate to generate the differential output signal $V_{OUT}$.

As an example, each of the first and second output stages 20 and 22 can include circuitry for sourcing output current for the respective one of the first and second output stages 20 and 22. The sourcing of output current can be controlled by the control voltage $V_{A1}$ in the first output stage 20 and by the control voltage $V_{B1}$ in the second output stage 22. The first and second output stages can also include circuitry for sinking output current for a respective one of the first and second output stages 20 and 22. The sinking of current can be controlled by the control voltage $V_{A2}$ in the first output stage 20 and by the control voltage $V_{B2}$ in the second output stage 22. The magnitudes of the sourcing and sinking currents can also depend on the magnitudes of the output voltages $V_{OUT+}$ and $V_{OUT-}$. For instance, the sourcing output current in the first output stage 20 can be a current that flows from the positive rail voltage $V_{DD}$ into the output node 24 and the sourcing output current in the second output stage 22 can be a current that flows from the positive rail voltage $V_{DD}$ into the output node 26. Similarly, the sinking output current in the first output stage 20 can be a current that flows from the output node 24 to ground and the sinking output current in the second output stage 22 can be a current that flows from the output node 26 to ground The sourcing output current in the first output stage 20 can be inversely proportional to the sinking output current in the first output stage 20 and the sourcing output current in the second output stage 22. Thus, the sourcing output current in the first output stage 20 and the sinking output current in the second output stage 22 are approximately equal and the sinking output current in the first output stage 20 and the sourcing output current in the second output stage are approximately equal. For example, a load (not shown) can be coupled between the output nodes 24 and 26. As a result, at a given time, the sourcing output current of one of the first and second output stages 20 and 22 can provide a portion of a current through the load that flows to ground as a portion of the sinking output current in the other of the first and second output stages 20 and 22.

Based on the inverse proportionality of the control voltages $V_{A1}$ and $V_{A2}$, as well as the control voltages $V_{B1}$ and $V_{B2}$, the magnitude of a quiescent current flow through the respective first and second output stages 20 and 22 can be mitigated while the appropriate magnitudes of the output voltages $V_{OUT+}$ and $V_{OUT-}$ are provided. Therefore, the differential amplifier system 10 can operate as a Class AB amplifier that provides the amplification accuracy that is substantially similar to a Class-A differential amplifier while providing a sourcing output current flow characteristic that is substantially similar to a Class-B differential amplifier. In addition, based on the configurations of the amplifier input stage 12 and the amplifier output stage 14 as demonstrated herein, the differential amplifier system 10 can be configured in an integrated circuit (IC) that occupies substantially less die area than typical Class-AB differential amplifier circuits.

The differential amplifier system 10 also includes a common-mode feedback circuit 28. The common-mode feedback circuit 28 is configured to provide feedback signals FB_A and FB_B to the respective first input stage 16 and second input stage 18. The common-mode feedback circuit 28 provides the feedback signals FB_A and FB_B to adjust the magnitude of the differential output signal $V_{OUT}$ to align the common-mode voltage of the differential output signal $V_{OUT}$ with the common-mode voltage $V_{CM\_IN}$ of the differential input signal $V_{IN}$. It is to be understood that the common-mode voltage $V_{CM\_IN}$ need not be the common-mode voltage of the differential input signal $V_{IN}$, but could merely be a reference signal, instead.

In the example of FIG. 1, the common-mode feedback circuit 28 includes an averaging circuit 30 that is configured to determine the common-mode voltage of the differential output signal $V_{OUT}$ based on $V_{OUT+}$ and $V_{OUT-}$. Thus, the common-mode feedback circuit 28 can compare the determined common-mode voltage of the differential output signal $V_{OUT}$ with the common-mode voltage $V_{CM\_IN}$ of the differential input signal $V_{IN}$. The common-mode feedback signals FB_A and FB_B can be current signals that have a magnitude that is based on the comparison, and can be implemented to adjust the magnitude of at least some of the control voltages, such as the control voltages $V_{A2}$ and $V_{B2}$. Accordingly, the common-mode feedback circuit 28 can maintain feedback control of the differential amplifier system 10 to maintain an appropriate magnitude of the common-mode voltage of the differential output signal $V_{OUT}$.

Figure 2:
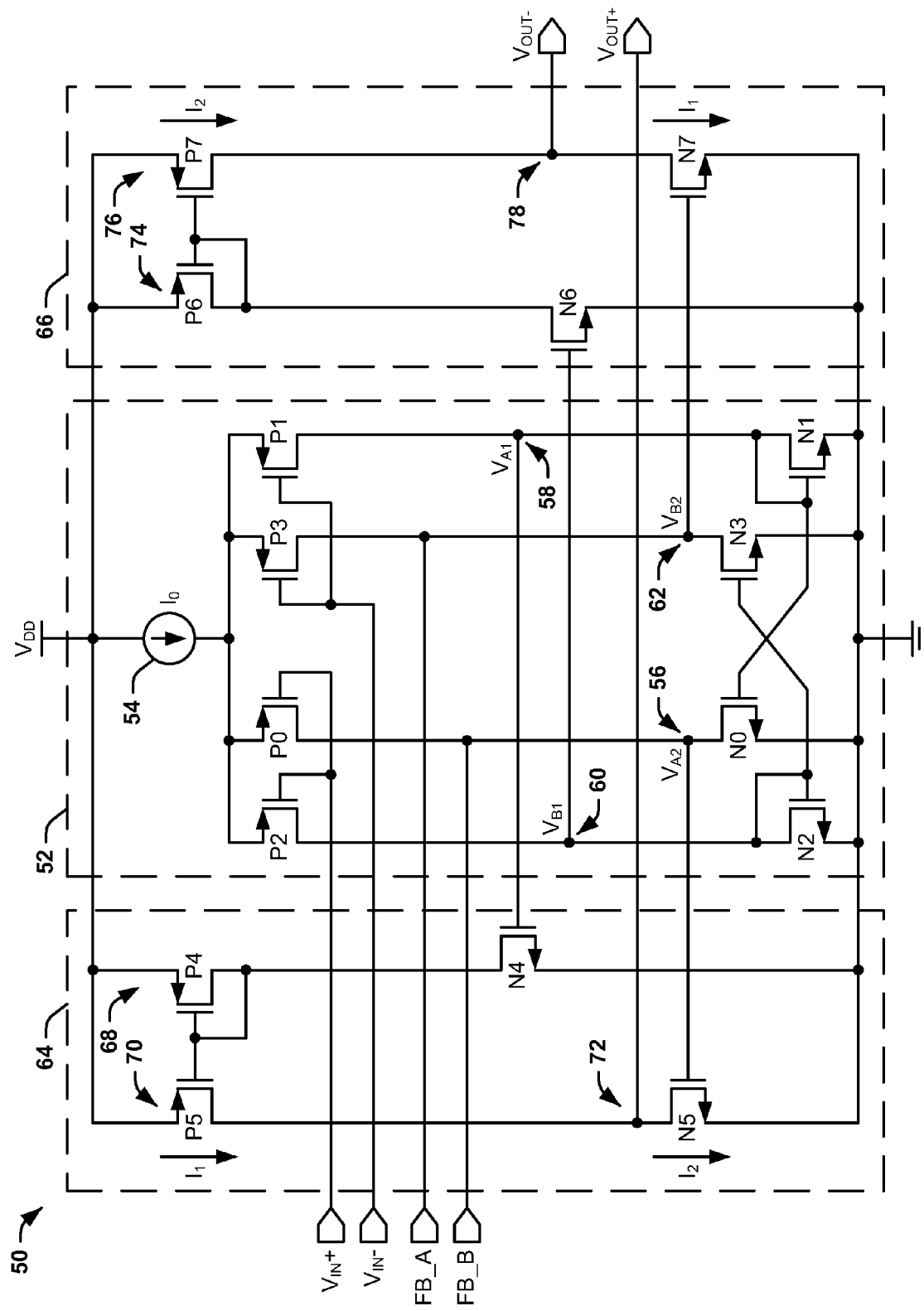
FIG. 2 illustrates an example of a differential amplifier circuit in accordance with an aspect of the invention.

FIG. 2 illustrates an example of a differential amplifier circuit 50 in accordance with an aspect of the invention. The differential amplifier circuit 50 can be a circuit diagram that is representative of a portion of the differential amplifier system 10 in the example of FIG. 1. Therefore, reference can be made to the differential amplifier system 10 in the example of FIG. 1 in the following description of the example of FIG. 2.

The differential amplifier circuit 50 includes an amplifier input stage 52 that is interconnected between a positive rail voltage $V_{DD}$ and a negative rail voltage, demonstrated in the example of FIG. 2 as ground. The amplifier input stage 52 includes a current source 54 that provides a substantially constant current $I_0$ from the positive rail voltage $V_{DD}$ to a first input stage and a second input stage. The first input stage is formed from a pair of P-type field effect transistors (P-FETs) P0 and P1 and a pair of N-type FETs N0 and N1. The P-FET P0 is controlled at a gate by the input voltage $V_{IN+}$ of the differential input signal $V_{IN}$ and the P-FET P1 is controlled at a gate by the input voltage $V_{IN-}$ of the differential input signal $V_{IN}$. The N-FETs N0 and N1 are configured as a current-mirror, such that the N-FETs N0 and N1 have a common-gate connection with the N-FET N1 having a common gate-drain connection. The P-FET P0 and the N-FET N0 are configured to generate the control voltage $V_{A2}$ at an interconnecting control node 56 in response to the input voltage $V_{IN+}$. Similarly, the P-FET P1 and the N-FET N1 are configured to generate the control voltage $V_{A1}$ of the first input stage at an interconnecting control node 58 in response to the input voltage $V_{IN-}$. Based on the configuration of the P-FETs P0 and P1 and the N-FETs N0 and N1, the control voltages $V_{A1}$ and $V_{A2}$ have magnitudes that are inversely proportional.

Similar to the first input stage, the second input stage is formed from a pair of P-FETs P2 and P3 and a pair of N-type FETs N2 and N3. The P-FET P2 is controlled at a gate by the input voltage $V_{IN+}$ and the P-FET P3 is controlled at a gate by the input voltage $V_{IN-}$. The N-FETs N2 and N3 are configured as a current-mirror, such that the N-FETs N2 and N3 have a common-gate connection and the N-FET N2 has a common gate-drain connection. The P-FET P2 and the N-FET N2 are configured to generate the control voltage $V_{B1}$ at a control node 60 in response to the input voltage $V_{IN+}$. Similarly, the P-FET P3 and the N-FET N3 are configured to generate the control voltage $V_{B2}$ at a control node 62 in response to the input voltage $V_{IN-}$. Based on the configuration of the P-FETs P2 and P3 and the N-FETs N2 and N3, the control voltages $V_{B1}$ and $V_{B2}$ have magnitudes that are inversely proportional to each other. Thus, as the magnitude of $V_{B1}$ increases, the magnitude of the control voltage $V_{B2}$ decreases proportionately. In addition, the P-FETs P0, P1, P2 and P3 can be substantially matched FETs and the N-FETs N0 through N3 can all be substantially matched FETs, such that the matched sets of FETs operate substantially the same with respect to process and temperature variations. Therefore, the control voltages $V_{A1}$ and $V_{B2}$ can have an approximately equal magnitude, and the control voltages $V_{A2}$ and $V_{B1}$ can have an approximately equal magnitude.

The differential amplifier circuit 50 includes a first output stage 64 and a second output stage 66 that collectively form an amplifier output stage, such as the amplifier output stage 14 in the example of FIG. 1. The first output stage 64 includes P-FETs P4 and P5 and N-FETs N4 and N5. The P-FETs P4 and P5 are configured as a current mirror having a common gates and a source that is coupled to $V_{DD}$. The resulting current mirror formed by P4 and P5 mirrors a current from a first current path 68 through P4 onto a second current path 70 through P5 to provide a sourcing output current $I_1$ flowing into an output node 72 of the first output stage 64. The N-FET N4 is configured in the first current path 68 and is controlled at a gate by the control voltage $V_{A1}$ to set a magnitude of the sourcing output current $I_1$. The N-FET N5 is configured in the second current path 70 and is controlled at a gate by the control voltage $V_{A2}$ to set a magnitude of a sinking output current $I_2$ flowing from the output node 72. Thus, the magnitudes of the sourcing and sinking output currents $I_1$ and $I_2$ of the first output stage 64 are set as a function of the magnitude of the output voltage $V_{OUT+}$ at the output node 72 based on the control applied to the P-FET P5 and the N-FET N5. In response to the control voltages $V_{A1}$ and $V_{A2}$, respectively. As an example, the N-FETs N4 and N5 can be matched FETs, such that the N-FETs N4 and N5 operate substantially the same with respect to process and temperature variations.

Similar to the first output stage 64 as described above, the second output stage 66 includes P-FETs P6 and P7 and N-FETs N6 and N7. The P-FETs P6 and P7 are configured as a current mirror that mirrors a current from a first current path 74 onto a second current path 76 as a sourcing output current $I_2$ flowing into an output node 78 of the second output stage 66. The N-FET N6 is configured in the first current path 74 between P6 and ground. The N-FET N6 is controlled at a gate by the control voltage $V_{B1}$ to establish current through N-FET N6. This current is mirrored from P6 to P7 to set a magnitude of the sourcing output current $I_2$. The N-FET N7 is configured in the second current path 76 between P7 and ground. N-FET N7 is controlled at a gate by the control voltage $V_{B2}$ to set a magnitude of a sinking output current $I_1$ flowing from the output node 78. The sourcing and sinking output currents $I_2$ and $I_1$ in the second output stage 66 can be approximately equal to the sourcing and sinking output currents $I_1$ and $I_2$ in the first output stage 64, respectively. Thus, the magnitudes of the sourcing and sinking output currents $I_1$ and $I_2$ of the second output stage 66 are set as a function of the magnitude of the output voltage $V_{OUT-}$ at the output node 78 based on control applied to the gates of the P-FET P7 and the N-FET N7 in response to the control voltages $V_{B1}$ and $V_{B2}$, respectively. As an example, the N-FETs N6 and N7 can be matched FETs, such that the N-FETs N6 and N7 operate substantially the same with respect to process and temperature variations.

Based on the configuration of the first and second input stages and the first and second output stages 64 and 66, the differential amplifier circuit 50 can generate the differential output signal $V_{OUT}$ as an amplified version of the differential input signal $V_{IN}$ with a substantially greater efficiency than a typical differential amplifier.

For example, in response to an increase in the input voltage $V_{IN+}$, and thus a decrease in the input voltage $V_{IN-}$, the magnitude of the control voltage $V_{A1}$ increases and the magnitude of the control voltage $V_{A2}$ decreases. In response to the increase in the magnitude of the control voltage $V_{A1}$, the current flow through the first current path 68 of the first output stage 64 increases (due to biasing of the N-FET N4), and thus increases the magnitude of the sourcing output current $I_1$. However, in response to the decrease in magnitude of the control voltage $V_{A2}$, the magnitude of the sinking output current $I_2$ flowing through the N-FET N5 decreases to substantially decrease the current flow through the first output stage 64.

Conversely, in response to the increase in the input voltage $V_{IN+}$, and thus the decrease in the input voltage $V_{IN-}$ (e.g., relative to the common-mode input voltage) the magnitude of the control voltage $V_{B1}$ decreases and the magnitude of the control voltage $V_{B2}$ increases proportionately. In response to the decrease in the magnitude of the control voltage $V_{B1}$, the current flow through the first current path 74 of the second output stage 66 decreases, and thus decreases the magnitude of the sourcing output current $I_2$ to substantially decrease the quiescent current flow through the second output stage 66. However, in response to the increase in magnitude of the control voltage $V_{B2}$, the magnitude of the sinking output current $I_1$ flowing through the N-FET N7 increases to substantially discharge the load current to ground. Accordingly, the sinking output current $I_1$ conducts a portion of the load current, as well as the current $I_2$, such that the differential amplifier circuit 50 can operate with both Class-A and Class-B current flow characteristics to efficiently amplify the differential input signal $V_{IN}$. It is to be understood that an opposite result occurs with respect to the output voltages $V_{OUT+}$ and $V_{OUT-}$, and thus the sourcing output currents $I_1$ and $I_2$, upon a decrease in the input voltage $V_{IN-}$ and an associated increase in the input voltage $V_{IN+}$.

The differential amplifier circuit 50 also receives feedback signals FB_A and FB_B as inputs to the control nodes 56 and 62. For example, a feedback signal FB_A is provided to the control node 62 of one input stage and a feedback signal FB_B is provided to the control node 56 of the other input stage. The feedback signals FB_A and FB_B can be provided from a common-mode feedback circuit, such as the common-mode feedback circuit 28 demonstrated in the example of FIG. 1, and can have approximately equal magnitudes. As an example, the feedback signals FB_A and FB_B can be generated from substantially equal current sources, such that the feedback signals FB_A and FB_B can source current to or sink an approximately equal magnitude of current from the respective control nodes 56 and 62 to provide corresponding common-mode control. As a result, the control voltages $V_{A2}$ and $V_{B2}$ can each be adjusted based on the feedback signals FB_A and FB_B. As an example, the common-mode control circuit can be configured to provide the feedback signals FB_A and FB_B to adjust each of the control voltages $V_{A2}$ and $V_{B2}$ by substantially the same amount. The adjustment to the control voltages $V_{A2}$ and $V_{B2}$ can result in the operation of each of the N-FETs N5 and N7 being likewise adjusted in response. Accordingly, the magnitudes of the output voltages $V_{OUT+}$ and $V_{OUT-}$ will increase or decrease by substantially the same magnitude reflecting the adjustment to the common-mode voltage of the differential output signal $V_{OUT}$ implemented by the common-mode feedback circuit that provides the signals FB_A and FB_B.

Figure 3:
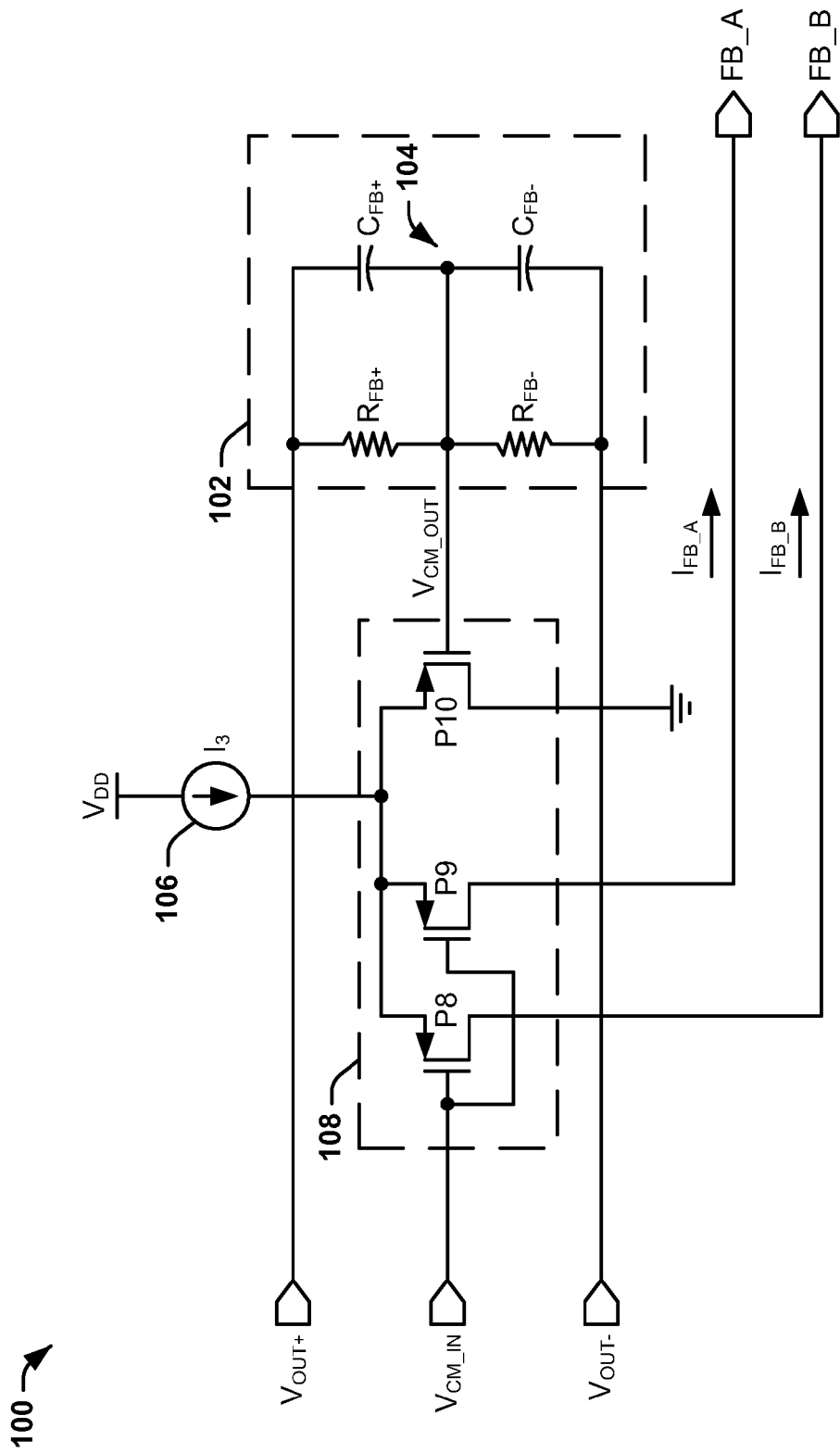
FIG. 3 illustrates an example of a common-mode feedback circuit in accordance with an aspect of the invention.

FIG. 3 illustrates an example of a common-mode feedback circuit 100 in accordance with an aspect of the invention. For example, the common-mode feedback circuit 100 can be configured to provide the feedback signals FB_A and FB_B described in the example of FIG. 2. For additional context, reference can be made to the differential amplifier system 50 in the example of FIG. 2 in the following description of the example of FIG. 3.

The common-mode feedback circuit 100 is configured to compare an input common-mode voltage $V_{CM\_IN}$ of the differential input signal $V_{IN}$ with an output common-mode voltage $V_{CM\_OUT}$ of the differential output signal $V_{OUT}$, and to adjust the differential output signal $V_{OUT}$ based on the comparison. The common-mode feedback circuit 100 includes an averaging circuit 102 that is configured to generate the output common-mode voltage $V_{CM\_OUT}$ based on the output voltages $V_{OUT+}$ and $V_{OUT-}$. In the example of FIG. 3, the averaging circuit 102 includes a resistor $R_{FB+}$ and a capacitor $C_{FB+}$ that are coupled in parallel with each other between the output voltage $V_{OUT+}$ and an averaging node 104 corresponding to the output common-mode voltage $V_{CM\_OUT}$. Similarly, a resistor $R_{FB-}$ and a capacitor $C_{FB-}$ are coupled in parallel with each other between the output voltage $V_{OUT-}$ and the averaging node 104. The resistors $R_{FB+}$ and $R_{FB-}$ can be selected to have substantially equal magnitudes of resistance and the capacitors $C_{FB+}$ and $C_{FB-}$ can be selected to have substantially equal magnitudes of capacitance. As a result, the output common-mode voltage $V_{CM\_OUT}$ can have a magnitude that is a mean value of the magnitudes of the output voltages $V_{OUT+}$ and $V_{OUT-}$. The values of the resistors and capacitors can be selected to provide an RC time constant to provide suitable time averaging and stability according to the expected variations in $V_{OUT+}$ and $V_{OUT-}$.

The common-mode feedback circuit 100 includes a current source 106 that generates a current $I_3$ from the positive rail voltage $V_{DD}$. In the example of FIG. 3, the current $I_3$ is provided to drains of a set of transistors that collectively form a current steering network 108. The current steering network 108 includes P-FETs P8 and P9 that are each coupled at a gate to the input common-mode voltage $V_{CM\_IN}$. The P-FET P8 has a source that provides the feedback signal FB_A and the P-FET P9 has a source that provides the feedback signal FB_B. The current steering network also includes a P-FET P10 having a gate coupled to the averaging node 104 corresponding to the output common-mode voltage $V_{CM\_OUT}$. The P-FET P10 has a source that is coupled to ground. As an example, the P-FETs P8 through P10 can each be matched FETs, such that they perform substantially independently of process and temperature variations with respect to each other.

Based on the configuration of the P-FETs P8 through P10, the current steering network 108 is configured to provide a portion of the current $I_3$ as the feedback signals FB_A and FB_B based on a relative magnitude of the input common-mode voltage $V_{CM\_IN}$ and the output common-mode voltage $V_{CM\_OUT}$. For example, a portion of the current $I_3$ is provided to ground via the P-FET P10, and the remainder of the current $I_3$ is provided as approximately equal portions as currents $I_{FB\_A}$ and $I_{FB\_B}$ that flow to the control nodes 62 and 56 in the example of FIG. 2, respectively. The magnitude of the current $I_3$ can be substantially fixed, such that the magnitudes of the currents $I_{FB\_A}$ and $I_{FB\_B}$ depend on the magnitude of the portion of the current $I_3$ that flows to ground via the P-FET P10. Accordingly, the magnitudes of the currents $I_{FB\_A}$ and $I_{FB\_B}$ depend on the relative magnitude of the input common-mode voltage $V_{CM\_IN}$ and the output common-mode voltage $V_{CM\_OUT}$. The currents $I_{FB\_A}$ and $I_{FB\_B}$ adjust the magnitudes of the control voltages $V_{A2}$ and $V_{B2}$ to correspondingly adjust the output voltages $V_{OUT+}$ and $V_{OUT-}$, as described above in the example of FIG. 2.

It is to be understood that the differential amplifier circuit 50 and the common-mode feedback circuit 100 are not intended to be limited to the examples of FIGS. 2 and 3, respectively. For example, the differential amplifier circuit 50 in the example of FIG. 2 can be configured as substantially inverted with respect to the positive rail voltage $V_{DD}$ and ground. For instance, the P-FETs P0 through P7 can be configured as N-FETs and the N-FETs N0 through N7 can be configured as P-FETs, with the current source 54 being configured to conduct the current $I_0$ to ground. Similarly, the P-FETs P8 through P10 can be configured as N-FETs configured to sink the currents $I_{FB\_A}$ and $I_{FB\_B}$ from the control nodes 62 and 56 instead of sourcing the currents $I_{FB\_A}$ and $I_{FB\_B}$ to the control nodes 62 and 56. As another example, the first and second input stages could be configured as different types of amplifier input stages, such as telescopic, folded cascode, simple, or a combination of these types of amplifier input stages with or without a tail current source. Furthermore, the current source 54 could be split into one or more current sources, such as to exhibit independent control of the current to the first and second input stages.

In addition, the common-mode feedback circuit 100 is not limited to the use of the averaging circuit 102 and the current steering network 108 to adjust the output voltages $V_{OUT+}$ and $V_{OUT-}$. As an example, the common-mode feedback circuit 100 can be configured to provide the averaging function of the output voltages $V_{OUT+}$ and $V_{OUT-}$ to generate the output common-mode voltage $V_{CM\_OUT}$ in a variety of different ways. The common-mode feedback circuit 100 can also be configured to perform common-mode control for adjusting the output voltages $V_{OUT+}$ and $V_{OUT-}$ in a variety of ways. As an example, the differential amplifier circuit 50 could include one or more additional stages of gain, such that the feedback signals FB_A and FB_B could be injected into one of the additional gain stages. As another example, the feedback signals FB_A and FB_B could be generated via current-mirrors and applied to the respective control nodes 62 and 56. As yet another example, although the P-FETs P0 through P3 in the amplifier input stage 52 in the example of FIG. 2 and the P-FETs P8 through P10 in the example of FIG. 3 are demonstrated as the same transistor types (i.e., P-FETs), it is to be understood that the respective sets of transistors could be configured as separate device types relative to each other. Furthermore, it is to be understood that the differential amplifier circuit 50 and the common-mode feedback circuit 100 can collectively be configured as an IC.

Figure 4:
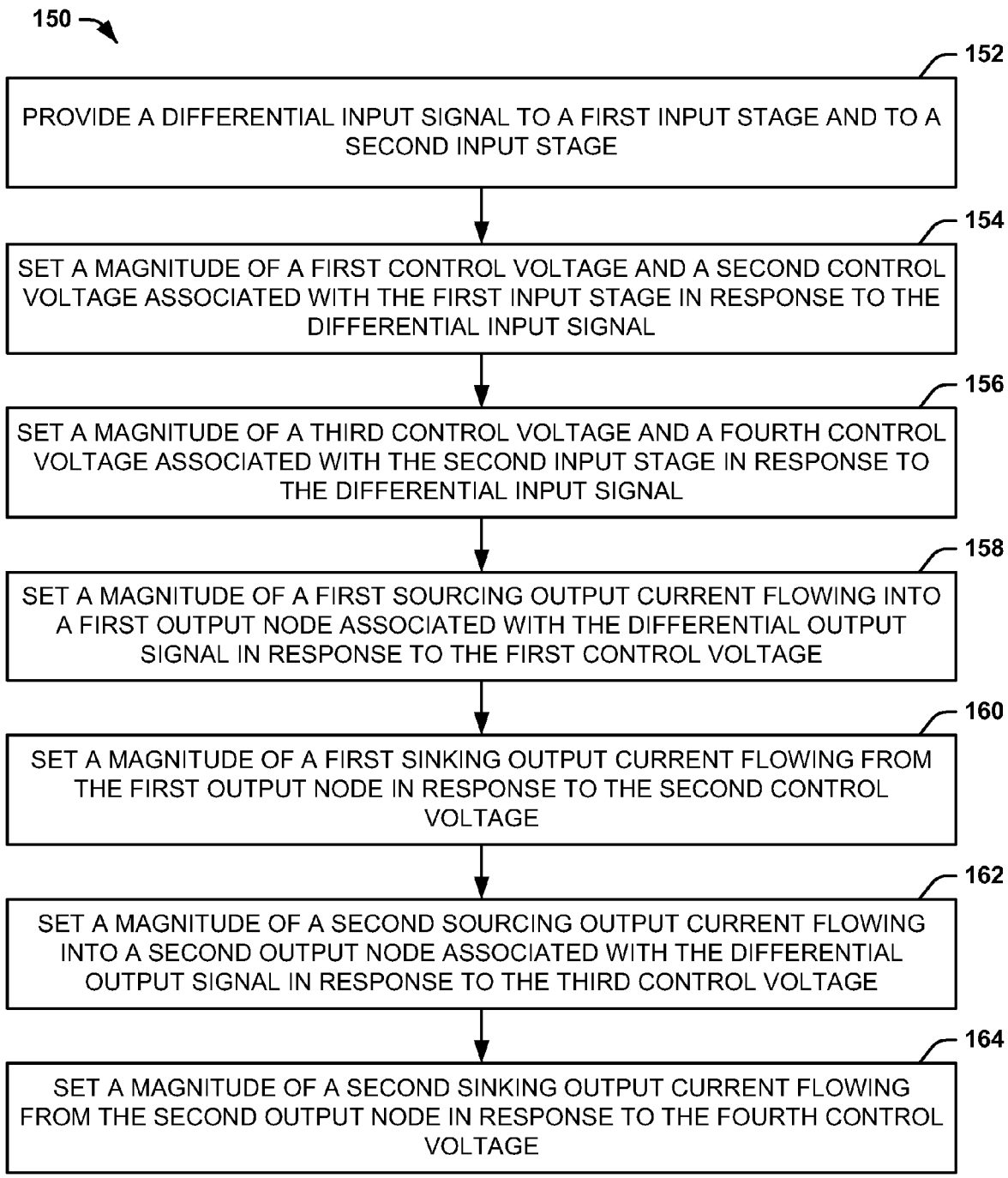
FIG. 4 illustrates an example of a method for amplifying a signal in accordance with an aspect of the invention.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 illustrates an example of a method 150 for amplifying a signal in accordance with an aspect of the invention. At 152, a differential input signal is provided to a first input stage and a second input stage. The first and second input stages can each be configured as shown and described herein with respect to FIG. 1 or 2. At 154, a magnitude of a first control voltage is set at a first control node and a second control voltage is set at a second control node associated with the first input stage in response to the differential input signal. At 156, a magnitude of a third control voltage is set at a third control node and a fourth control voltage is set at a fourth control node associated with the second input stage in response to the differential input signal. The first and second control voltages can have respective magnitudes that are inversely proportional and the third and fourth control voltages can have respective magnitudes that also are inversely proportional. The first control voltage can be approximately equal to the fourth control voltage and the second control voltage can be approximately equal to the third control voltage.

At 158, a magnitude of a first sourcing output current flowing into a first output node associated with the differential output signal is set in response to the first control voltage. At 160, a magnitude of a first sinking output current flowing from the first output node is set in response to the second control voltage. At 162, a magnitude of a second sourcing output current flowing into a second output node associated is set in response to the third control voltage. At 164, a magnitude of a second sinking output current flowing from the second output node is set in response to the fourth control voltage. The magnitudes of the first and second sourcing and sinking currents can be set based on magnitudes of first and output voltages at the first and second output nodes. A load can be coupled to the first and second output nodes, such that a load current can be provided through the load via one of the first and second sourcing output currents and can flow to ground via the opposite of the first and second sinking output currents. The other of the first and second sourcing output currents and the opposite of the first and second sinking currents can be a quiescent current that can maintain minimal Class-A functionality of the differential amplifier circuit. The method 150 will typically repeat to provide for operation of a differential amplifier based on the teachings contained herein.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A differential amplifier circuit comprising:
   a first input stage that generates a first control voltage and a second control voltage in response to a differential input signal, the first and second control voltages being inversely proportional;
   a second input stage that generates a third control voltage and a fourth control voltage in response to the differential input signal, the third and fourth control voltages being inversely proportional;
   a first output stage that is configured to set a magnitude of a first output voltage of a differential output signal at a first output node in response to the first and second control voltages; and
   a second output stage that is configured to set a magnitude of a second output voltage of the differential output signal at a second output node in response to the third and fourth control voltages.

2. The circuit of claim 1, wherein the first output stage comprises a first current mirror that generates a first sourcing output current to the first output node, the first sourcing output current having a magnitude that is set by the first control voltage from a first current path to a second current path, and wherein the second output stage comprises a second current mirror that generates a second sourcing output current to the second output node, the second sourcing output current having a magnitude that is set by the third control voltage from a third current path to a fourth current path.

3. The circuit of claim 2, wherein the first current path comprises a first transistor that is controlled by the first control voltage, and wherein the third current path comprises a second transistor that is controlled by the third control voltage;
   wherein the second current path comprises a third transistor that is controlled by the second control voltage to set a magnitude of a first sinking output current from the first output node, and wherein the second current path comprises a fourth transistor that is controlled by the fourth control voltage to set a magnitude of a second sinking output current from the second output node.

4. The circuit of claim 1, wherein the first input stage comprises:
   a first differential transistor pair that is controlled by the differential input signal; and
   a first current mirror transistor arrangement that is coupled to the first differential transistor pair via a first control node and a second control node and being configured to mirror a current flow from a first transistor of the first differential transistor pair to a second transistor of the first differential transistor pair; and
   wherein the second input stage comprises:
   a second differential transistor pair that is controlled by the differential input signal; and
   a second current mirror transistor arrangement that is coupled to the second differential transistor pair via a third control node and a fourth control node and being configured to mirror a current flow from a first transistor of the second differential transistor pair to a second transistor of the second differential transistor pair.

5. The circuit of claim 4, wherein the first control voltage is generated at the first control node, the second control voltage is generated at the second control node, the third control voltage is generated at the third control node, and the fourth control voltage is generated at the fourth control node.

6. The circuit of claim 1, further comprising a common-mode feedback circuit configured to control a common-mode voltage of the differential output signal relative to a common-mode voltage of the differential input signal.

7. The circuit of claim 6, wherein the common-mode feedback circuit comprises an averaging circuit that is configured to generate the common-mode voltage of the differential output signal at an output node as an average of the differential output signal in response to receiving the first output voltage at a first input and the second output voltage at a second input.

8. The circuit of claim 6, wherein the common-mode feedback circuit comprises:
a first transistor that is controlled by the common-mode voltage of the differential input signal to generate a first feedback current to adjust a magnitude of the first control voltage based on a magnitude of the common-mode voltage of the differential input signal relative to the common-mode voltage of the differential output signal; and
a second transistor that is controlled by the common-mode voltage of the differential input signal to generate a second feedback current to adjust a magnitude of the third control voltage based on the magnitude of the common-mode voltage of the differential input signal relative to the common-mode voltage of the differential output signal.

9. The circuit of claim 8, further comprising a third transistor that is controlled by the common-mode voltage of the differential output signal and is configured to set a magnitude of the first and second feedback current based on the magnitude of the common-mode voltage of the differential input signal relative to the common-mode voltage of the differential output signal.

10. The circuit of claim 1, wherein each of the first and second output stages comprises a pair of current mirror transistors coupled to drains of the respective first and second pairs of output transistors to set a magnitude of a first current flowing into the respective first and second output nodes as inversely proportional relative to a magnitude of a second current flowing from the respective first and second output nodes.

11. The circuit of claim 1, wherein the first output stage comprises a first transistor and a second transistor configured to cooperatively set a magnitude of the first output voltage in response to the first and second control voltages, respectively, and wherein the second output stage comprises a third transistor and a fourth transistor configured to cooperatively set a magnitude of the second output voltage in response to the third and fourth control voltages, respectively.

12. An integrated circuit comprising the differential amplifier circuit of claim 1.

13. A method for amplifying a differential input signal to generate a differential output signal, the method comprising:
providing the differential input signal to a first input stage;
setting a magnitude of a first control voltage at a first control node and a second control voltage at a second control node associated with the first input stage in response to the differential input signal, the first and second control voltages having respective magnitudes that are inversely proportional to each other;
setting a magnitude of a first sourcing output current that flows to a first output node in a first output stage that provides a first portion of the differential output signal in response to the first control voltage;
setting a magnitude of a first sinking output current that flows from the first output node in response to the second control voltage;
providing the differential input signal to a second input stage;
setting a magnitude of a third control voltage and a fourth control voltage associated with the second input stage in response to the differential input signal, the third and fourth control voltages having respective magnitudes that are inversely proportional to each other and are approximately equal to magnitudes of the second and first control voltages, respectively;
setting a magnitude of a second output sourcing current that flows to a second output node in a second output stage that provides a second portion of the differential output signal in response to the third control voltage; and
setting a magnitude of a second sinking output current that flows from the second output node in response to the second control voltage.

14. A method for amplifying a differential input signal to generate a differential output signal, the method comprising:
providing the differential input signal to a first input stage
setting a magnitude of a first control voltage at a first control node and a second control voltage at a second control node associated with the first input stage in response to the differential input signal, the first and second control voltages having respective magnitudes that are inversely proportional to each other
setting a magnitude of a first sourcing output current that flows to a first output node in a first output stage that provides a first portion of the differential output signal in response to the first control voltage, wherein the step of setting a magnitude of the first sourcing output current includes:
generating a current in a first current path in the first output stage based on the first control voltage; and
mirroring the current generated in the first current path to a second current path in the first output stage as the first sourcing output current; and
setting a magnitude of a first sinking output current that flows from the first output node in response to the second control voltage.

15. The method of claim 14, wherein setting the magnitude of the first sinking output current comprises biasing a transistor in the second current path based on the second control voltage.

16. A method for amplifying a differential input signal to generate a differential output signal, the method comprising:
providing the differential input signal to a first input stage;
setting a magnitude of a first control voltage at a first control node and a second control voltage at a second control node associated with the first input stage in response to the differential input signal, the first and second control voltages having respective magnitudes that are inversely proportional to each other;
setting a magnitude of a first sourcing output current that flows to a first output node in a first output stage that provides a first portion of the differential output signal in response to the first control voltage;

setting a magnitude of a first sinking output current that flows from the first output node in response to the second control voltage;

comparing an input common-mode voltage of the differential input signal with an output common-mode voltage of the differential output signal;

generating a feedback current based on a relative magnitude of the input common-mode voltage and the output common-mode voltage; and adjusting a magnitude of the second control voltage based on the feedback current.

17. The method of claim 16, further comprising:

biasing a first transistor based on the input common-mode voltage;

biasing a second transistor based on the output common-mode voltage;

steering a portion of a sourced current through each of the first and second transistors based on the relative magnitudes of the input common-mode voltage and the output common-mode voltage to set a magnitude of the feedback current.

18. A differential amplifier circuit comprising:

a first input stage that generates a first control voltage and a second control voltage in response to a differential input signal, the first and second control voltages being inversely proportional;

a second input stage that generates a third control voltage and a fourth control voltage in response to the differential input signal, the third and fourth control voltages being inversely proportional;

a first output stage that is configured to set a magnitude of a first output voltage of a differential output signal at a first output node in response to the first and second control voltages;

a second output stage that is configured to set a magnitude of a second output voltage of the differential output signal at a second output node in response to the third and fourth control voltages; and a common-mode feedback circuit configured to control a common-mode voltage of the differential output signal relative to a common-mode voltage of the differential input signal.

19. The circuit of claim 18, wherein the common-mode feedback circuit comprises an averaging circuit that is configured to generate the common-mode voltage of the differential output signal at an output node as an average of the differential output signal in response to receiving the first output voltage at a first input and the second output voltage at a second input, the common-mode feedback circuit providing feedback to adjust one of the first and second control voltages and to adjust one of the third and fourth control voltages based on a comparison of the common-mode voltage of the differential output signal and the common-mode voltage of the differential input signal.

* * * * *